(12) United States Patent
Yang et al.

(10) Patent No.: US 11,615,848 B2
(45) Date of Patent: Mar. 28, 2023

(54) MEMORY CONTROL METHOD, MEMORY STORAGE DEVICE, AND MEMORY CONTROL CIRCUIT UNIT

(71) Applicant: PHISON ELECTRONICS CORP., Miaoli (TW)

(72) Inventors: Yu-Siang Yang, New Taipei (TW); Wei Lin, Taipei (TW); An-Cheng Liu, Taipei (TW); Yu-Heng Liu, Hsinchu County (TW); Chun-Hsi Lai, Hsinchu County (TW); Ting-Chien Zhan, Hsinchu (TW)

(73) Assignee: PHISON ELECTRONICS CORP., Miaoli (TW)

( * ) Notice: Subject to any disclaimer, the term of this patent is extended or adjusted under 35 U.S.C. 154(b) by 4 days.

(21) Appl. No.: 17/214,958

(22) Filed: Mar. 29, 2021

(65) Prior Publication Data
US 2022/0293185 A1 Sep. 15, 2022

(30) Foreign Application Priority Data
Mar. 10, 2021 (TW) .................................. 110108553

(51) Int. Cl.
*G11C 16/00* (2006.01)
*G11C 16/10* (2006.01)
(Continued)

(52) U.S. Cl.
CPC ............ *G11C 16/10* (2013.01); *G06F 3/0604* (2013.01); *G06F 3/0652* (2013.01);
(Continued)

(58) Field of Classification Search
CPC . G11C 29/023; G11C 29/50012; G11C 29/82; G11C 5/04; G11C 5/148; G11C 7/00; G11C 7/222; G11C 16/06; G11C 16/24; G11C 16/30; G11C 2029/1802; G11C 29/12005; G11C 29/14; G11C 29/18; G11C 29/56004; G11C 29/56016;
(Continued)

(56) References Cited

U.S. PATENT DOCUMENTS

| 11,146,295 B1* | 10/2021 | Lin | ........................ H03M 13/23 |
| 2020/0312410 A1* | 10/2020 | Lu | .......................... G11C 16/34 |
| 2021/0306010 A1* | 9/2021 | Lin | ........................ H03M 13/23 |

FOREIGN PATENT DOCUMENTS

| TW | 536705 | 6/2003 |
| TW | 201541457 | 11/2015 |

OTHER PUBLICATIONS

"Office Action of Taiwan Counterpart Application", dated Dec. 27, 2021, pp. 1-6.

* cited by examiner

Primary Examiner — Thong Q Le
(74) Attorney, Agent, or Firm — JCIPRNET

(57) ABSTRACT

A memory control method, a memory storage device, and a memory control circuit unit are provided. The memory control method includes: programming multiple first memory cells in a first physical erasing unit in a rewritable non-volatile memory module; and applying an electronic pulse to at least one word line in the rewritable non-volatile memory module. The at least one word line is coupled to multiple second memory cells in the first physical erasing unit. The second memory cells include the first memory cells. The electronic pulse is not configured to read, program, or erase the second memory cells.

24 Claims, 8 Drawing Sheets

(51) Int. Cl.
  *G06F 3/06*    (2006.01)
  *G11C 16/04*   (2006.01)
  *G11C 16/14*   (2006.01)
  *G11C 16/08*   (2006.01)
  *G11C 11/56*   (2006.01)

(52) U.S. Cl.
  CPC .......... *G06F 3/0659* (2013.01); *G06F 3/0679* (2013.01); *G11C 16/0483* (2013.01); *G11C 16/08* (2013.01); *G11C 16/14* (2013.01); *G11C 11/5671* (2013.01)

(58) Field of Classification Search
  CPC ........... G11C 7/1009; G11C 7/16; G11C 7/24; G06F 11/1068; G06F 11/1048; G06F 12/0246; G06F 11/1072; G06F 13/1668; G06F 2212/1024; G06F 2212/1032; G06F 2212/7201; G06F 2212/7203; G06F 11/1012; G06F 3/06; G06F 3/0619; G06F 11/108; G06F 11/1417; G06F 12/16; G06F 2212/7202; G06F 3/0604; G06F 9/4403; G06F 9/4408; G06F 9/445; G06F 1/08; G06F 11/076; G06F 11/10; G06F 11/1004; G06F 13/28; G06F 13/4022; G06F 13/4282; G06F 3/061; G06F 3/0652; G06F 3/0655; G06F 3/0658; G06F 3/0679; G06F 3/0688
  USPC ........ 711/103, E12.008; 365/185.03, 185.18, 365/185.19, 185.21, 185.24
  See application file for complete search history.

MEMORY CONTROL METHOD, MEMORY STORAGE DEVICE, AND MEMORY CONTROL CIRCUIT UNIT

CROSS-REFERENCE TO RELATED APPLICATION

This application claims the priority benefit of Taiwan application serial no. 110108553, filed on Mar. 10, 2021. The entirety of the above-mentioned patent application is hereby incorporated by reference herein and made a part of this specification.

BACKGROUND

Technical Field

The disclosure relates to a memory control technology, and particularly relates to a memory control method, a memory storage device, and a memory control circuit unit.

Description of Related Art

Digital cameras, mobile phones, and MP3 players have grown rapidly over the past few years, which has led to a rapid increase in consumer demand for storage media. Since the rewritable non-volatile memory module (for example, a flash memory) has characteristics such as non-volatile data, power saving, small size, and no mechanical structure, the rewritable non-volatile memory module is very suitable to be built into the various portable multimedia devices exemplified above.

Memory cells in the rewritable non-volatile memory module achieve the objective of storing data by injecting charge into the memory cells. However, the charge injected into the memory cells may be lost as data storage time increases, data access operation increases, and/or temperature changes, thereby resulting in increased decoding difficulty when subsequently reading data. In addition, the lost charge may also resist the erase voltage when subsequently erasing the memory cells, thereby resulting in decreased erasing efficiency of the memory cells.

SUMMARY

The disclosure provides a memory control method, a memory storage device, and a memory control circuit unit, which can improve the data preservation capacity and/or the data erasing efficiency of memory cells.

An exemplary embodiment of the disclosure provides a memory control method, which is applicable to a rewritable non-volatile memory module. The rewritable non-volatile memory module includes multiple physical erasing units. The memory control method includes the following steps. Multiple first memory cells in a first physical erasing unit among the physical erasing units are programmed. An electronic pulse is applied to at least one word line of the rewritable non-volatile memory module. The at least one word line is coupled to multiple second memory cells in the first physical erasing unit. The second memory cells include the programmed first memory cells. The electronic pulse is not configured to read, program, or erase the second memory cells.

An exemplary embodiment of the disclosure further provides a memory storage device, which includes a connection interface unit, a rewritable non-volatile memory module, and a memory control circuit unit. The connection interface unit is configured to couple to a host system. The rewritable non-volatile memory module includes multiple physical erasing units. The memory control circuit unit is coupled to the connection interface unit and the rewritable non-volatile memory module. The memory control circuit unit is configured to transmit a write command sequence to instruct to program multiple first memory cells in a first physical erasing unit among the physical erasing units. The rewritable non-volatile memory module is configured to apply an electronic pulse to at least one word line. The at least one word line is coupled to multiple second memory cells in the first physical erasing unit. The second memory cells include the programmed first memory cells. The electronic pulse is not configured to read, program, or erase the second memory cells.

An exemplary embodiment of the disclosure further provides a memory control circuit unit, which includes a host interface, a memory interface, and a memory management circuit. The host interface is configured to couple to a host system. The memory interface is configured to couple to a rewritable non-volatile memory module. The rewritable non-volatile memory module includes multiple physical erasing units. The memory management circuit is coupled to the host interface and the memory interface. The memory management circuit is configured to transmit a write command sequence to instruct to program multiple first memory cells in a first physical erasing unit among the physical erasing units. The memory management circuit is further configured to transmit a special control command to instruct to apply an electronic pulse to at least one word line of the rewritable non-volatile memory module. The at least one word line is coupled to multiple second memory cells in the first physical erasing unit. The second memory cells include the programmed first memory cells. The electronic pulse is not configured to read, program, or erase the second memory cells.

Based on the above, after programming the first memory cells in the first physical erasing unit, the electronic pulse may be applied to the at least one word line of the rewritable non-volatile memory module. The at least one word line is coupled to the second memory cells in the first physical erasing unit. The second memory cells include the programmed first memory cells. In particular, the electronic pulse is not configured to read, program, or erase the second memory cells. In this way, the data preservation capacity and/or the data erasing efficiency of the memory cells can be improved.

DETAILED DESCRIPTION OF DISCLOSED EMBODIMENTS

Generally speaking, a memory storage device (also referred to as a memory storage system) includes a rewritable non-volatile memory module and a controller (also referred to as a control circuit). Usually, the memory storage device is used together with a host system, so that the host system may write data to the memory storage device or read data from the memory storage device.

Figure 1:
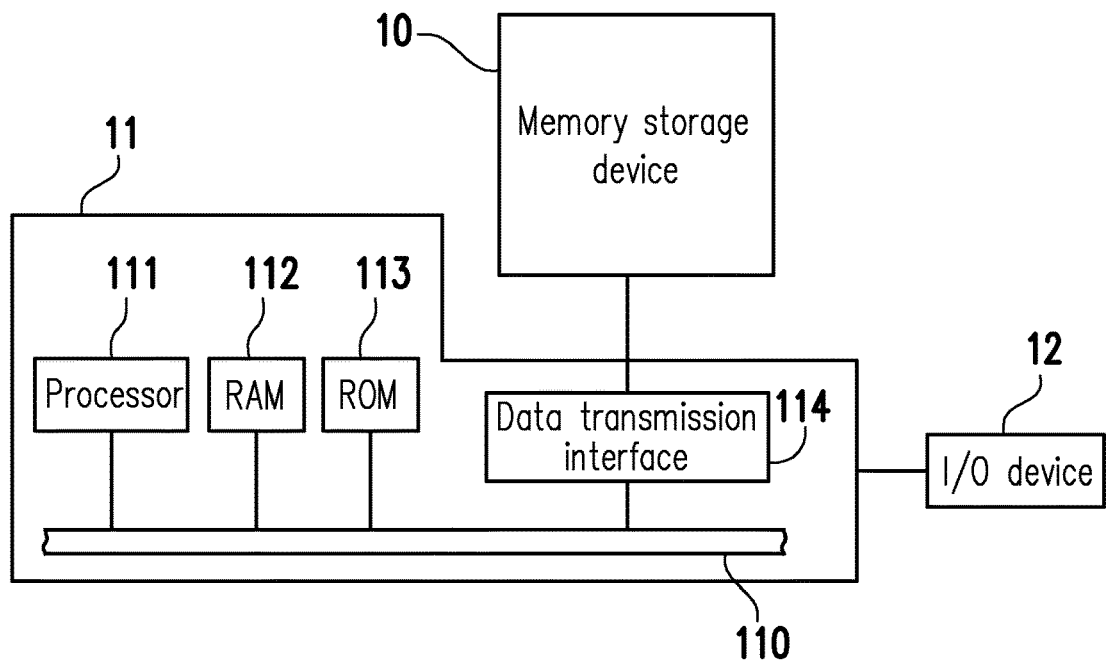
FIG. 1 is a schematic diagram of a host system, a memory storage device, and an input/output (I/O) device according to an exemplary embodiment of the disclosure.
Figure 2:
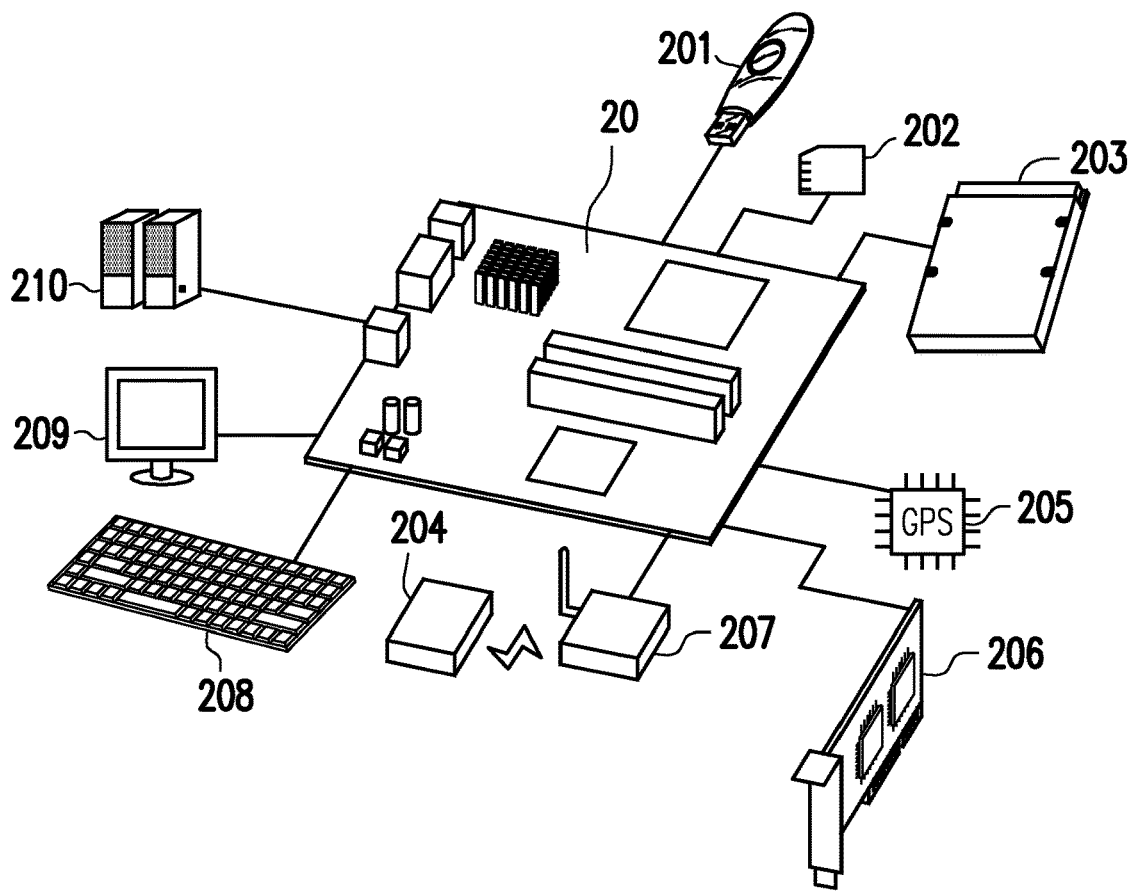
FIG. 2 is a schematic diagram of a host system, a memory storage device, and an I/O device according to an exemplary embodiment of the disclosure.

FIG. 1 is a schematic diagram of a host system, a memory storage device, and an input/output (I/O) device according to an exemplary embodiment of the disclosure. FIG. 2 is a schematic diagram of a host system, a memory storage device, and an I/O device according to an exemplary embodiment of the disclosure.

Please refer to FIG. 1 and FIG. 2. A host system 11 generally includes a processor 111, a random access memory (RAM) 112, a read only memory (ROM) 113, and a data transmission interface 114. The processor 111, the random access memory 112, the read only memory 113, and the data transmission interface 114 are all coupled to a system bus 110.

In an exemplary embodiment, the host system 11 is coupled to a memory storage device 10 through the data transmission interface 114. For example, the host system 11 may store data to the memory storage device 10 or read data from the memory storage device 10 via the data transmission interface 114. In addition, the host system 11 is coupled to an I/O device 12 through the system bus 110. For example, the host system 11 may transmit an output signal to the I/O device 12 or receive an input signal from the I/O device 12 via the system bus 110.

In an exemplary embodiment, the processor 111, the random access memory 112, the read only memory 113, and the data transmission interface 114 may be disposed on a motherboard 20 of the host system 11. The number of the data transmission interface 114 may be one or more. Through the data transmission interface 114, the motherboard 20 may be coupled to the memory storage device 10 via wired or wireless means. The memory storage device 10 may, for example, be a flash drive 201, a memory card 202, a solid state drive (SSD) 203, or a wireless memory storage device 204. The wireless memory storage device 204 may, for example, be a near field communication (NFC) memory storage device, a wireless fax (WiFi) memory storage device, a Bluetooth memory storage device, a low power consumption Bluetooth memory storage device (for example, iBeacon), or other memory storage devices based on various wireless communication technologies. In addition, the motherboard 20 may also be coupled to various I/O devices such as a global positioning system (GPS) module 205, a network interface card 206, a wireless transmission device 207, a keyboard 208, a screen 209, and a speaker 210 through the system bus 110. For example, in an exemplary embodiment, the motherboard 20 may access the wireless memory storage device 204 through the wireless transmission device 207. In an exemplary embodiment, the host system is a computer system. In an exemplary embodiment, the host system is any system that may substantially cooperate with a memory storage device to store data.

Figure 3:
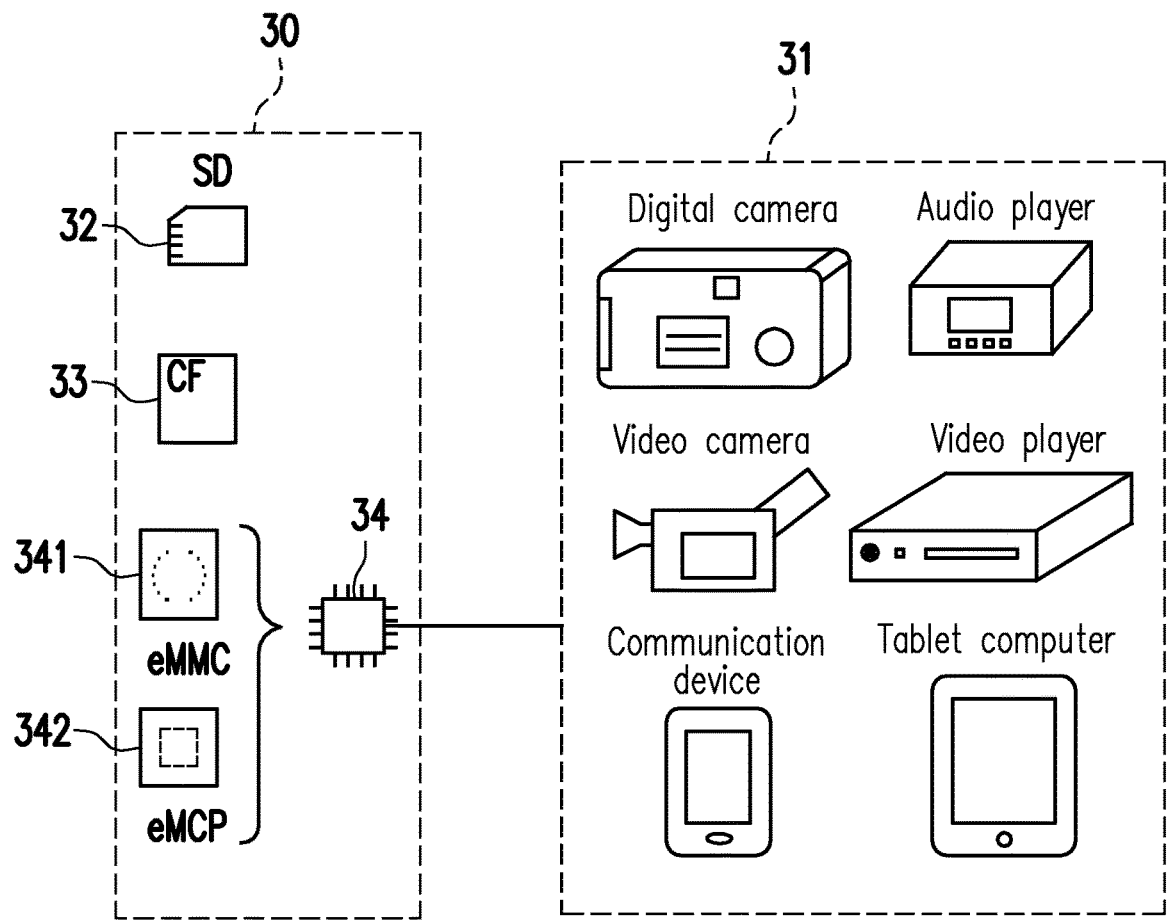
FIG. 3 is a schematic diagram of a host system and a memory storage device according to an exemplary embodiment of the disclosure.

FIG. 3 is a schematic diagram of a host system and a memory storage device according to an exemplary embodiment of the disclosure. Please refer to FIG. 3. In an exemplary embodiment, a host system 31 may also be a system such as a digital camera, a video camera, a communication device, an audio player, a video player, or a tablet computer, and a memory storage device 30 may be various non-volatile memory storage devices such as a secure digital (SD) card 32, a compact flash (CF) card 33, or an embedded storage device 34 used thereby. The embedded storage device 34 includes various embedded storage devices in which a memory module is directly coupled onto a substrate of a host system, such as an embedded multi media card (eMMC) 341 and/or an embedded multi chip package (eMCP) storage device 342.

Figure 4:
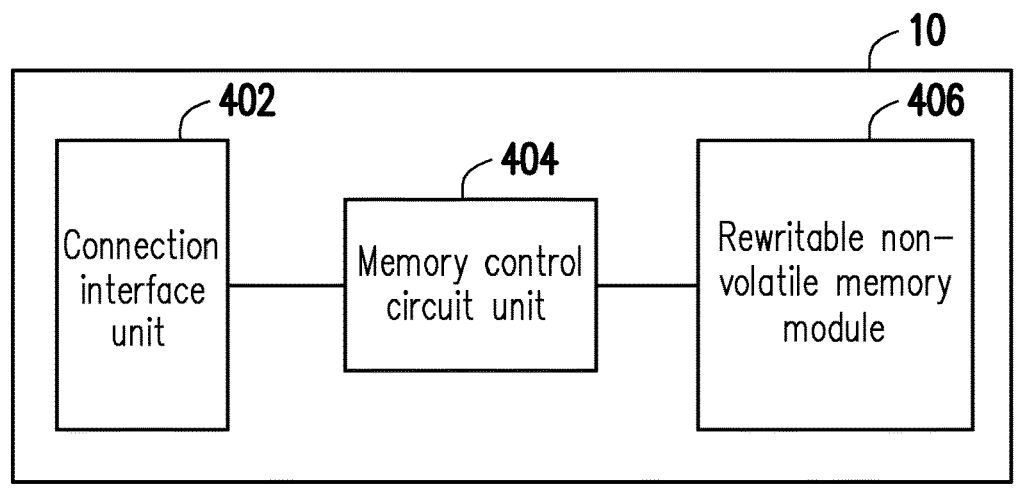
FIG. 4 is a schematic block diagram of a memory storage device according to an exemplary embodiment of the disclosure.

FIG. 4 is a schematic block diagram of a memory storage device according to an exemplary embodiment of the disclosure. Please refer to FIG. 4. The memory storage device 10 includes a connection interface unit 402, a memory control circuit unit 404, and a rewritable non-volatile memory module 406.

The connection interface unit 402 is configured to couple the memory storage device 10 to the host system 11. The memory storage device 10 may communicate with the host system 11 through the connection interface unit 402. In an exemplary embodiment, the connection interface unit 402 is compatible with the serial advanced technology attachment (SATA) standard. However, it must be understood that the disclosure is not limited thereto, and the connection interface unit 402 may also conform to the parallel advanced technology attachment (PATA) standard, the Institute of Electrical and Electronic Engineers (IEEE) 1394 standard, the peripheral component interconnect express (PCI express) standard, the universal serial bus (USB) standard, the SD interface standard, the ultra high speed-I (UHS-I) interface standard, the ultra high speed-II (UHS-II) interface standard, the memory stick (MS) interface standard, the multi chip package (MCP) interface standard, the multi media card (MMC) interface standard, the eMMC interface standard, the universal flash storage (UFS) interface standard, the eMCP interface standard, the CF interface standard, the integrated device electronics (IDE) standard, or other suitable standards. The connection interface unit 402 and the memory control circuit unit 404 may be packaged in one chip, or the connection interface unit 402 may be arranged outside a chip containing the memory control circuit unit 404.

The memory control circuit unit 404 is configured to execute multiple logic gates or control commands implemented in the form of hardware or the form of firmware and perform operations such as writing, reading, and erasing data in the rewritable non-volatile memory module 406 according to the commands of the host system 11.

The rewritable non-volatile memory module 406 is coupled to the memory control circuit unit 404 and is configured to store data written by the host system 11. The rewritable non-volatile memory module 406 may be a single level cell (SLC) NAND flash memory module (that is, a flash memory module that may store 1 bit in a memory cell), a multi level cell (MLC) NAND flash memory module (that is, a flash memory module that may store 2 bits in a memory cell), a triple level cell (TLC) NAND flash memory module (that is, a flash memory module that may store 3 bits in a memory cell), a quad level cell (QLC) NAND flash memory module (that is, a flash memory module that may store 4 bits in a memory cell), other flash memory modules, or other memory modules with the same characteristics.

Each memory cell in the rewritable non-volatile memory module 406 stores one or more bits with changes in voltage (hereinafter also referred to as a threshold voltage). Specifically, there is a charge trapping layer between a control gate and a channel of each memory cell. Through applying a write voltage to the control gate, the number of electrons in the charge trapping layer may be changed, thereby changing the threshold voltage of the memory cell. This operation of changing the threshold voltage of the memory cell is also referred to as "writing data to the memory cell" or "programming the memory cell". As the threshold voltage changes, each memory cell in the rewritable non-volatile memory module 406 has multiple storage statuses. Through applying a read voltage, it is possible to determine which storage status a memory cell belongs to, thereby obtaining one or more bits stored in the memory cell.

Figure 5A:
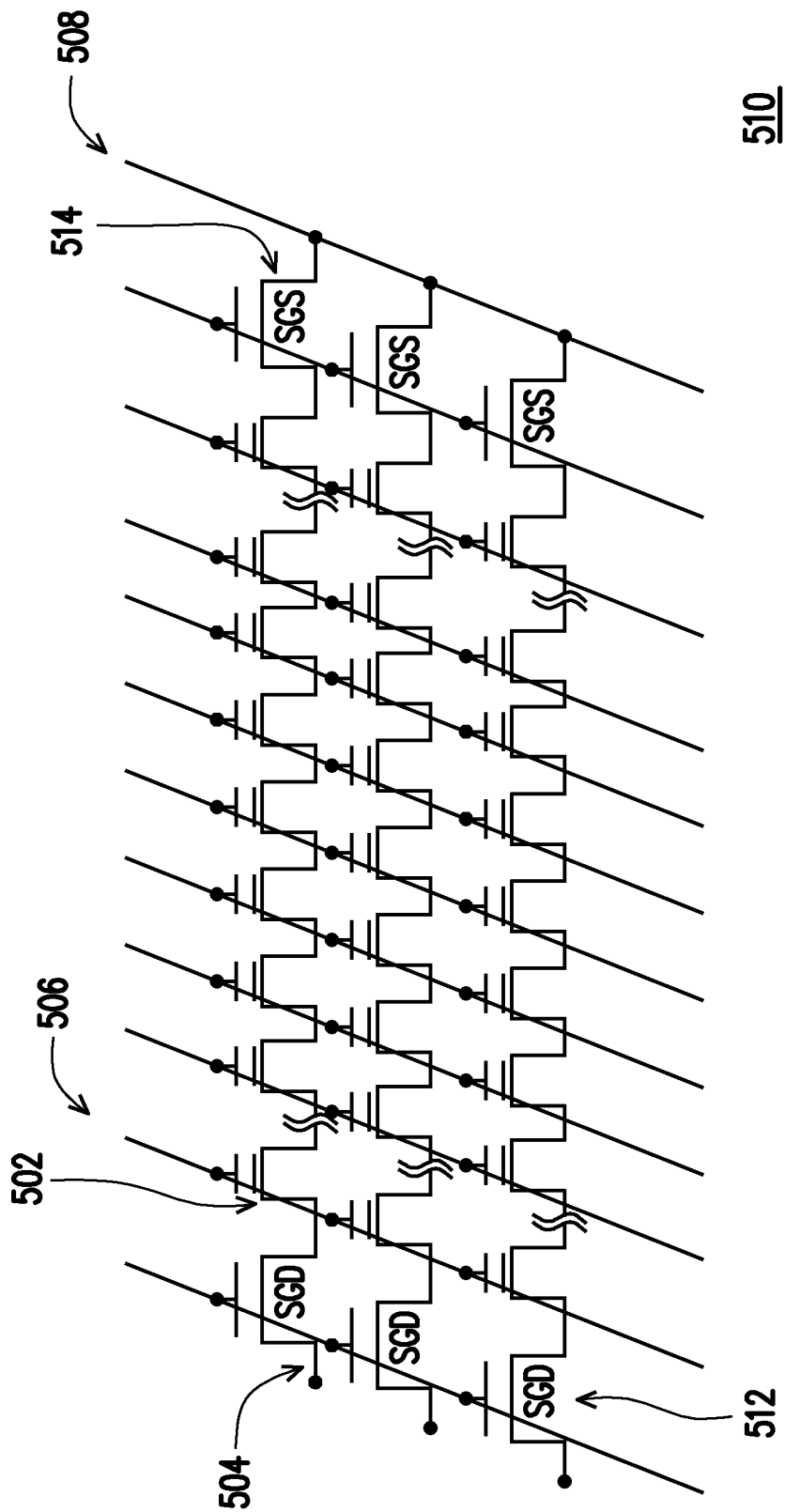
FIG. 5A is a schematic diagram of a memory cell array according to an exemplary embodiment of the disclosure.

FIG. 5A is a schematic diagram of a memory cell array according to an exemplary embodiment of the disclosure. Please refer to FIG. 5A. A memory cell array 510 includes multiple memory cells 502 for storing data, multiple select gate drain (SGD) transistors 512, multiple select gate source (SGS) transistors 514, multiple bit lines 504 connecting the memory cells 502, multiple word lines 506, and a common source line 508. The memory cells 502 are arranged in an array at intersections of the bit lines 504 and the word lines 506, as shown in FIG. 5A. The rewritable non-volatile memory module 406 may include multiple memory cell arrays 510. The memory cell arrays 510 may be stacked horizontally and/or vertically.

Figure 5B:
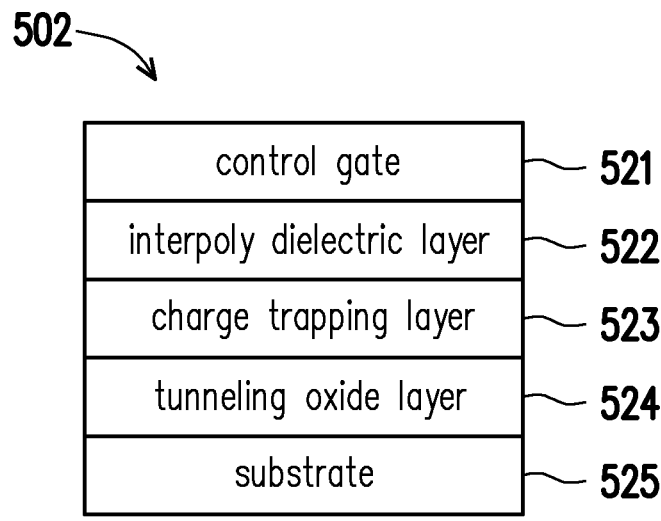
FIG. 5B is a schematic diagram of a memory cell according to an exemplary embodiment of the disclosure.

FIG. 5B is a schematic diagram of a memory cell according to an exemplary embodiment of the disclosure. Please refer to FIG. 5B. The memory cell 502 is also referred to as a flash memory element. The memory cell 502 includes a control gate 521, an interpoly dielectric layer 522, a charge trapping layer 523, a tunneling oxide layer 524, and a substrate 525. The control gate 521 may be coupled to the word line 506 of FIG. 5A. The charge trapping layer 523 is configured to store electrons. The control gate 521, the interpoly dielectric layer 522, the charge trapping layer 523, and the tunneling oxide layer 524 are sequentially stacked on the substrate 525.

When data is to be written to the memory cell 502 (that is, programming the memory cell 502), by applying the write voltage (also referred to as a programmable voltage), the voltage (that is, the threshold voltage) of the memory cell 502 may be changed by injecting electrons into the charge trapping layer 523. The threshold voltage may be configured to reflect a data storage status of the memory cell 502. For example, different threshold voltages of the memory cell 502 may reflect different data storage statuses of the memory cell 502. By adjusting the voltage of the memory cell 502 to a certain voltage position, data storage of the memory cell 502 may be implemented. On the other hand, when the stored data is to be removed from the memory cell 502, the injected electrons may be removed from the charge trapping layer 523 by applying an erase voltage. The erased memory cell 502 may be restored to the status before being programmed.

Figure 5C:
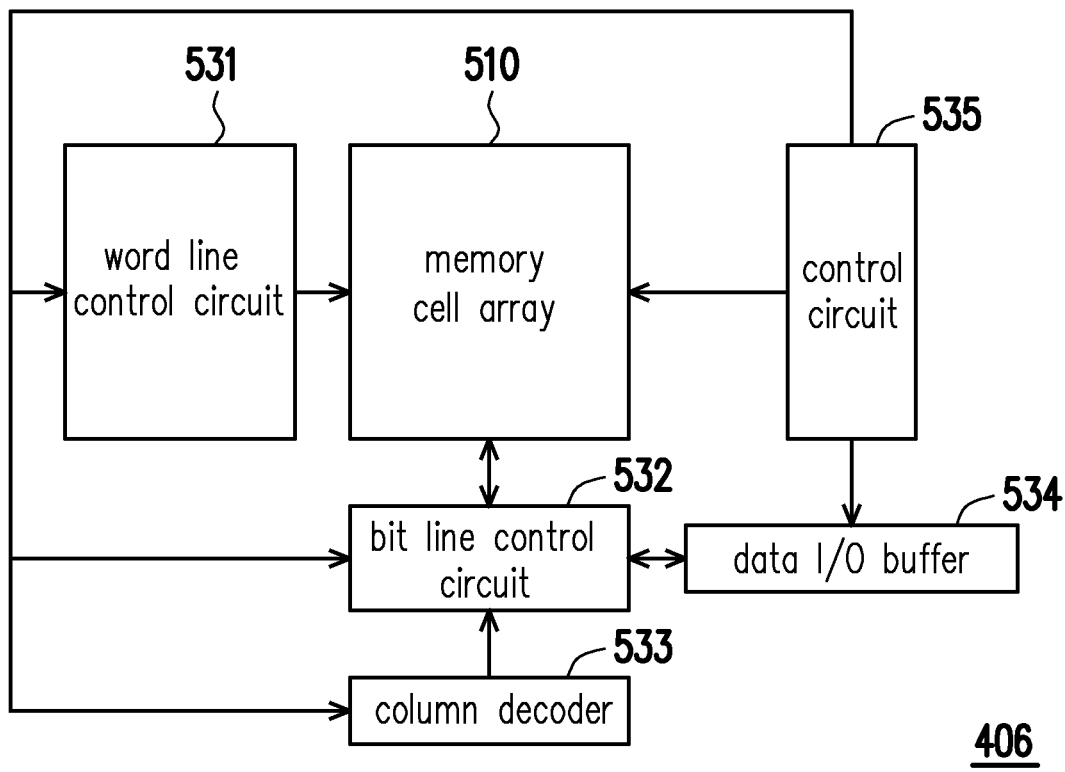
FIG. 5C is a schematic block diagram of a rewritable non-volatile memory module according to an exemplary embodiment of the disclosure.

FIG. 5C is a schematic block diagram of a rewritable non-volatile memory module according to an exemplary embodiment of the disclosure. Please refer to FIG. 5C. The rewritable non-volatile memory module 406 includes the memory cell array 510, a word line control circuit 531, a bit line control circuit 532, a column decoder 533, a data I/O buffer 534, and a control circuit 535.

The word line control circuit 531 is configured to control the voltage applied to the word line 506 of FIG. 5A. The bit line control circuit 532 is configured to control the voltage applied to the bit line 504 of FIG. 5A. The column decoder 533 is configured to select a corresponding bit line according to a decoding row address in a write command sequence or a read command sequence. The data I/O buffer 534 is configured to temporarily store data. The control circuit 535 may control the word line control circuit 531, the bit line control circuit 532, the column decoder 533, and the data I/O buffer 534 to write data to the memory cell array 510 or read data from the memory cell array 510.

In an exemplary embodiment, the memory cells of the rewritable non-volatile memory module 406 may constitute multiple physical programming units, and the physical programming units may constitute multiple physical erasing units. Specifically, the memory cells on the same word line may form one or more physical programming units. If each memory cell may store more than 2 bits, the physical programming units on the same word line may be classified into at least a lower physical programming unit and an upper physical programming unit. For example, a least significant bit (LSB) of a memory cell belongs to the lower physical programming unit, and a most significant bit (MSB) of a memory cell belongs to the upper physical programming unit. Generally speaking, in the MLC NAND flash memory, the write speed of the lower physical programming unit is greater than the write speed of the upper physical programming unit, and/or the reliability of the lower physical programming unit is higher than the reliability of the upper physical programming unit.

In an exemplary embodiment, the physical programming unit is the smallest unit of programming. That is, the physical programming unit is the smallest unit of writing data. For example, the physical programming unit may be a physical page or a physical sector. If the physical programming unit is a physical page, the physical programming units may include a data bit area and a redundancy bit area. The data bit area contains multiple physical sectors for storing user data, and the redundancy bit area is configured to store system data (for example, management data such as an error correcting code). In an exemplary embodiment, the data bit area contains 32 physical sectors, and the size of one physical sector is 512 bytes (B). However, in other exemplary embodiments, the data bit area may also contain 8, 16, more, or less physical sectors, and the size of each physical sector may also be greater or smaller. On the other hand, the physical erasing unit is the smallest unit of erasure. That is, each physical erasing unit contains the smallest number of memory cells to be erased together. For example, the physical erasing unit is a physical block.

Figure 6:
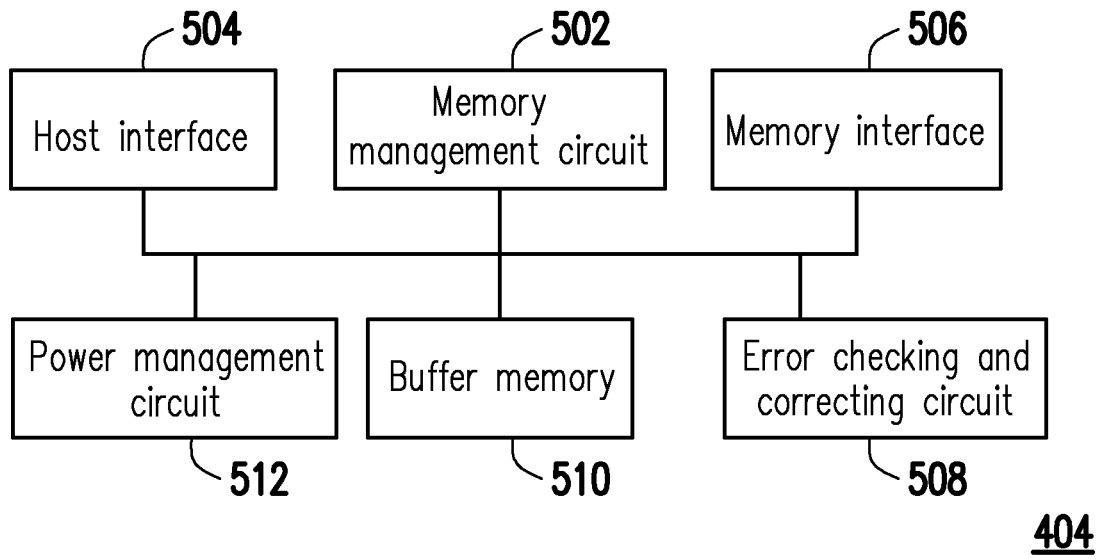
FIG. 6 is a schematic block diagram of a memory control circuit unit according to an exemplary embodiment of the disclosure.

FIG. 6 is a schematic block diagram of a memory control circuit unit according to an exemplary embodiment of the disclosure. Please refer to FIG. 6. The memory control circuit unit 404 includes a memory management circuit 602, a host interface 604, and a memory interface 606.

The memory management circuit 602 is configured to control the overall operation of the memory control circuit unit 404. Specifically, the memory management circuit 602 has multiple control commands, and the control commands are executed to perform operations such as writing, reading, and erasing data when the memory storage device 10 is operating. The following description of the operation of the memory management circuit 602 is equivalent to the description of the operation of the memory control circuit unit 404.

In an exemplary embodiment, the control commands of the memory management circuit 602 are implemented in the form of firmware. For example, the memory management circuit 602 has a microprocessor unit (not shown) and a read only memory (not shown), and the control commands are burnt to the read only memory. When the memory storage device 10 is operating, the control commands are executed by the microprocessor unit to perform operations such as writing, reading, and erasing data.

In another exemplary embodiment, the control commands of the memory management circuit 602 may also be stored in a specific area (for example, a system area dedicated to storing system data in a memory module) of the rewritable non-volatile memory module 406 in the form of program codes. In addition, the memory management circuit 602 has a microprocessor unit (not shown), a read only memory (not shown), and a random access memory (not shown). In particular, the read only memory has a boot code, and the microprocessor unit first executes the boot code to load the control commands stored in the rewritable non-volatile memory module 406 to the random access memory of the memory management circuit 602 when the memory control circuit unit 404 is enabled. After that, the microprocessor unit runs the control commands to perform operations such as writing, reading, and erasing data.

In addition, in another exemplary embodiment, the control commands of the memory management circuit 602 may also be implemented in the form of hardware. For example, the memory management circuit 602 includes a microcontroller, a memory cell management circuit, a memory write circuit, a memory read circuit, a memory erase circuit, and a data processing circuit. The memory cell management circuit, the memory write circuit, the memory read circuit, the memory erase circuit, and the data processing circuit are coupled to the microcontroller. The memory cell management circuit is configured to manage a memory cell or a memory cell group of the rewritable non-volatile memory module 406. The memory write circuit is configured to issue a write command sequence to the rewritable non-volatile memory module 406 to write data to the rewritable non-volatile memory module 406. The memory read circuit is configured to issue a read command sequence to the rewritable non-volatile memory module 406 to read data from the rewritable non-volatile memory module 406. The memory erase circuit is configured to issue an erase command sequence to the rewritable non-volatile memory module 406 to erase data from the rewritable non-volatile memory module 406. The data processing circuit is configured to process data to be written to the rewritable non-volatile memory module 406 and data read from the rewritable non-volatile memory module 406. The write command sequence, the read command sequence, and the erase command sequence may each include one or more program codes or command codes and are configured to instruct the rewritable non-volatile memory module 406 to execute corresponding operations such as writing, reading, and erasing. In an exemplary embodiment, the memory management circuit 602 may also issue other types of command sequences to the rewritable non-volatile memory module 406 to instruct to execute corresponding operations.

The host interface 604 is coupled to the memory management circuit 602. The memory management circuit 602 may communicate with the host system 11 through the host interface 604. The host interface 604 may be configured to receive and identify commands and data transmitted by the host system 11. For example, the commands and the data transmitted by the host system 11 may be transmitted to the memory management circuit 602 through the host interface 604. In addition, the memory management circuit 602 may transmit the data to the host system 11 through the host interface 604. In an exemplary embodiment, the host interface 604 is compatible with the SATA standard. However, it must be understood that the disclosure is not limited thereto, and the host interface 604 may also be compatible with the PATA standard, the IEEE 1394 standard, the PCI express standard, the USB standard, the SD interface standard, the UHS-I interface standard, the UHS-II interface standard, the MS interface standard, the MMC interface standard, the eMMC interface standard, the UFS interface standard, the CF interface standard, the IDE standard, or other suitable data transmission standards.

The memory interface 606 is coupled to the memory management circuit 602 and is configured to access the rewritable non-volatile memory module 406. In other words, the data to be written to the rewritable non-volatile memory module 406 is converted into a format acceptable by the rewritable non-volatile memory module 406 via the memory interface 606. Specifically, if the memory management circuit 602 intends to access the rewritable non-volatile memory module 406, the memory interface 606 will transmit corresponding command sequences. For example, the command sequences may include the write command sequence instructing to write data, the read command sequence instructing to read data, the erase command sequence instructing to erase data, and corresponding command sequences instructing various memory operations (for example, changing a read voltage level, executing a garbage collection operation, etc.). The command sequences are, for example, generated by the memory management circuit 602 and transmitted to the rewritable non-volatile memory module 406 through the memory interface 606. The command sequences may include one or more signals, or data on a bus. The signals or the data may include command codes or program codes. For example, the read command sequence includes information such as a read recognition code and a memory address.

In an exemplary embodiment, the memory control circuit unit 404 further includes an error detecting and correcting circuit 608, a buffer memory 610, and a power management circuit 612.

The error detecting and correcting circuit (also referred to as a decoding circuit) 608 is coupled to the memory management circuit 602 and is configured to execute error detecting and correcting operations to ensure the correctness of data. Specifically, when the memory management circuit 602 receives a write command from the host system 11, the error detecting and correcting circuit 608 generates a corresponding error correcting code (ECC) and/or error detecting code (EDC) for data corresponding to the write command, and the memory management circuit 602 writes the data corresponding to the write command and the corresponding ECC and/or EDC to the rewritable non-volatile memory module 406. Later, when the memory management circuit 602 reads the data from the rewritable non-volatile memory module 406, the ECC and/or the EDC corresponding to the data will also be simultaneously read, and the error detecting and correcting circuit 608 will execute the error checking and correcting operations on the read data according to the ECC and/or the EDC.

The power management circuit 612 is coupled to the memory management circuit 602 and is configured to control the power of the memory storage device 10. The buffer memory 610 is coupled to the memory management circuit 602 and is configured to temporarily store data and commands from the host system 11 or data from the rewritable non-volatile memory module 406.

In an exemplary embodiment, the rewritable non-volatile memory module 406 of FIG. 4 is also referred to as a flash memory module, the memory control circuit unit 404 is also referred to as a flash memory controller for controlling the flash memory module, and/or the memory management circuit 602 of FIG. 6 is also referred to as a flash memory management circuit.

The memory management circuit 602 may be configured with logical units to map physical units in the rewritable non-volatile memory module 406. For example, a logical unit may refer to a logical address, a logical programming unit, a logical erasing unit, or a combination of multiple continuous or discontinuous logical addresses. For example, a physical unit may refer to a physical address, a physical programming unit, a physical erasing unit, or a combination of multiple continuous or discontinuous physical addresses. In addition, a logical unit may be mapped to one or more physical units.

The memory management circuit 602 may record a mapping relationship (also referred to as a logical-physical mapping relationship) between a logical unit and a physical unit in at least one logical-physical mapping table. When the host system 11 intends to read data from the memory storage device 10 or write data to the memory storage device 10, the memory management circuit 602 may execute data access on the memory storage device 10 according to the logical-physical mapping table.

In an exemplary embodiment, the memory management circuit 602 may transmit a write command sequence to the rewritable non-volatile memory module 406. The write command sequence may be configured to instruct the rewritable non-volatile memory module 406 to program multiple memory cells (also referred to as first memory cells) in a certain physical erasing unit (also referred to as a first physical erasing unit). The first memory cells may belong to the same physical programming unit. The programmed first memory cells may be configured to store data. For example, the write command sequence may be transmitted in response to a write command from the host system 11. The programmed first memory cells may be configured to store the data corresponding to the write command.

Figure 7:
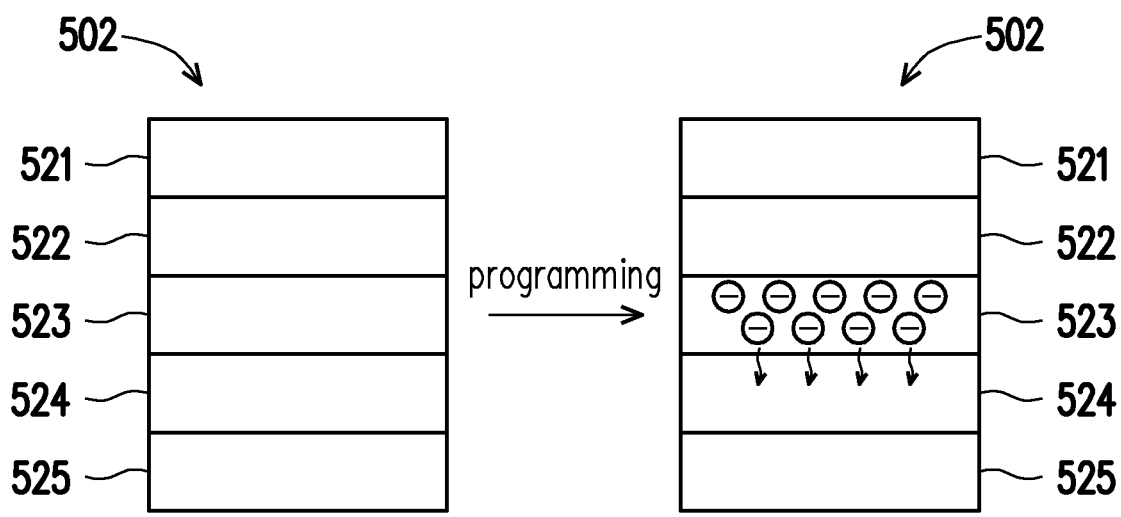
FIG. 7 is a schematic diagram of programming a memory cell according to an exemplary embodiment of the disclosure.

FIG. 7 is a schematic diagram of programming a memory cell according to an exemplary embodiment of the disclosure. Please refer to FIG. 7. After programming the memory cell 502, electrons may be injected into the charge trapping layer 523 of the memory cell 502, thereby changing the voltage (that is, the threshold voltage) of the memory cell 502. In addition, the number of electrons injected into the charge trapping layer 523 may be different to reflect a bit value of one or more bits stored in the memory cell 502.

It should be noted that as data storage time in the memory cell 502 increases, data access operation to the memory cell 502 increases, and/or temperature of the memory cell 502 changes, the electrons preserved in the charge trapping layer 523 may gradually be lost. For example, some electrons may be lost from the charge trapping layer 523 to the tunneling oxide layer 524, as shown in FIG. 7. Once the number of lost electrons exceeds a preset value, an excessive voltage shift may cause the storage status of the memory cell 502 to change, such as from an original storage bit "0" (that is, a correct bit) to a storage bit "1" (that is, an error bit). When voltage shift occurs for more and more memory cells 502, data subsequently read from the memory cells 502 may contain more error bits, thereby resulting in increased decoding difficulty when subsequently reading the data.

In an exemplary embodiment, after programming the first memory cells in the first physical erasing unit, the memory management circuit 602 may transmit a special control command to the rewritable non-volatile memory module 406. The special control command may instruct the rewritable non-volatile memory module 406 to apply an electronic pulse to at least one word line. The at least one word line is coupled to multiple memory cells (also referred to as second memory cells) in the first physical erasing unit. The second memory cells include the programmed first memory cells.

It should be noted that compared to the write voltage configured to write data, the read voltage configured to read data, and/or the erase voltage configured to erase data, the electronic pulse is not configured to read, program, or erase the second memory cells. In other words, the electronic pulse is not configured to read data from a programmed memory cell or change a storage status of the programmed memory cell.

In an exemplary embodiment, the electronic pulse is configured to change the number of electrons in the tunneling oxide layer of at least one of the second memory cells (or the first memory cells). Through changing the number of electrons in the tunneling oxide layer of the programmed memory cell, the data quality of the data stored in the memory cell and/or the operation stability when subsequently executing operations such as erasing can be improved.

In an exemplary embodiment, the second memory cells may include all memory cells in the first physical erasing unit. In an exemplary embodiment, the second memory cells may include the first memory cells and some other memory cells in the first physical erasing unit. In an exemplary embodiment, the second memory cells may only include the first memory cells.

In an exemplary embodiment, the electronic pulse may carry a positive voltage. That is, after programming the first memory cells in the first physical erasing unit, the electronic pulse carrying the positive voltage may be applied to the second memory cells containing the first memory cells in the first physical erasing unit. The electronic pulse carrying the positive voltage may be configured to slightly increase the number of electrons in the tunneling oxide layer of at least one of the second memory cells.

Figure 8A:
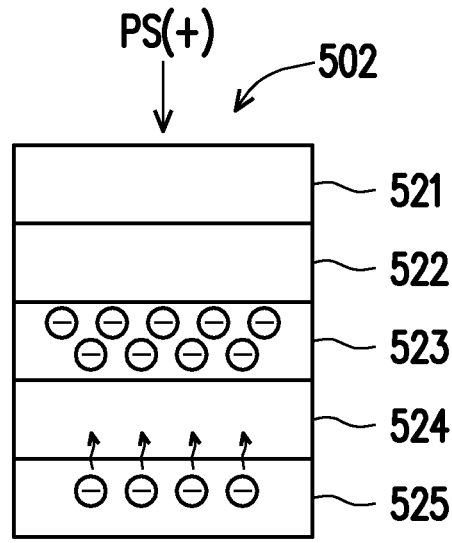
FIG. 8A is a schematic diagram of applying an electronic pulse carrying a positive voltage to a memory cell according to an exemplary embodiment of the disclosure.

FIG. 8A is a schematic diagram of applying an electronic pulse carrying a positive voltage to a memory cell according to an exemplary embodiment of the disclosure. Please refer to FIG. 8A. The memory cell 502 is taken as an example of a certain second memory cell. After applying an electronic pulse PS(+) carrying a positive voltage to the control gate 521 of the memory cell 502, some electrons may be attracted from the substrate 525 to the tunneling oxide layer 524 and stay in the tunneling oxide layer 524. The electrons staying in the tunneling oxide layer 524 may repel the electrons originally injected into the charge trapping layer 523 by programming the memory cell 502, thereby reducing the probability of electrons in the charge trapping layer 523 being lost to the tunneling oxide layer 524. Once the probability of electrons in the charge trapping layer 523 being lost to the tunneling oxide layer 524 decreases, the probability of the threshold voltage of the memory cell 502 shifting correspondingly decreases, thereby improving the data quality of the data stored in the memory cell 502.

In an exemplary embodiment, the voltage of the electronic pulse PS(+) may be slightly higher than the voltage (also referred to as a channel voltage) of the substrate 525 of the memory cell 502. In this way, after applying the electronic pulse PS(+) to the memory cell 502, some free electrons originally located in the substrate 525 may be attracted to the tunneling oxide layer 524.

Figure 8B:
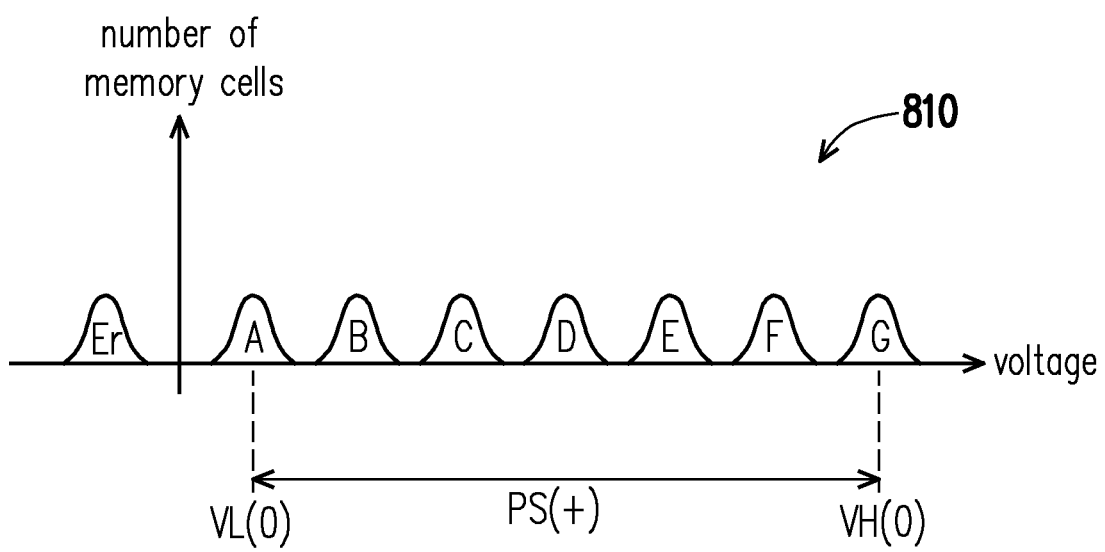
FIG. 8B is a schematic diagram of a voltage range of the electronic pulse carrying the positive voltage according to an exemplary embodiment of the disclosure.

FIG. 8B is a schematic diagram of a voltage range of the electronic pulse carrying the positive voltage according to an exemplary embodiment of the disclosure. Please refer to FIG. 8A and FIG. 8B. In an exemplary embodiment, it is assumed that the first memory cell (or the second memory cell) is operating in a TLC programming mode (that is, a memory cell may be configured to store 3 bits). A threshold voltage distribution 810 of the first memory cell (or the second memory cell) may contain 8 statuses, which are respectively Er and A to G. The 8 statuses respectively correspond to different data storage statuses. For example, the status Er corresponds to bits "111", the status G corresponds to "000", etc. It should be noted that the status Er is also referred to as an erasure status. That is, after erasing a certain memory cell, the erased memory cell is in the status Er.

In an exemplary embodiment, the voltage of the electronic pulse PS(+) may be approximately between voltages VL(0) and VH(0). The voltage VL(0) is a preset voltage level corresponding to the status A. The voltage VH(0) is a preset voltage level corresponding to the status G. Alternatively, in an exemplary embodiment, assuming that there is a middle voltage level (for example, at the vertical axis of FIG. 8B) between a preset voltage level corresponding to the status Er and the preset voltage level corresponding to the status A, the voltage of the electronic pulse PS(+) may be between the middle voltage level and the preset voltage level corresponding to any status (the statuses A to G) to the right of the middle voltage level. Alternatively, in an exemplary embodiment, the electronic pulse PS(+) only needs to carry a relatively positive voltage compared to the substrate 525 (or the channel) of the memory cell 502.

In an exemplary embodiment, the memory management circuit 602 may repeatedly transmit the special control command to the rewritable non-volatile memory module 406 every time a time interval has elapsed. As such, every time a time interval has elapsed, the rewritable non-volatile memory module 406 may repeatedly execute the operation of applying the electronic pulse carrying the positive voltage (for example, the electronic pulse PS(+) in FIG. 8A) to the at least one word line (or the second memory cell), thereby continuously improving or maintaining the data quality of the data stored in the first memory cell (or the second memory cell).

In an exemplary embodiment, the memory management circuit 602 may obtain the temperature of the rewritable non-volatile memory module 406. For example, the temperature may be detected by a temperature sensor of the memory storage device 10 or the host system 11. In an exemplary embodiment, the temperature of the rewritable non-volatile memory module 406 may also reflect the internal temperature of the memory storage device 10 or the external ambient temperature.

In an exemplary embodiment, the memory management circuit 602 may adjust the time interval according to the temperature. In an exemplary embodiment, the time length of the time interval may be negatively correlated with the temperature. For example, when the temperature of the rewritable non-volatile memory module 406 gradually increases, the memory management circuit 602 may gradually shorten the time length of the time interval. Conversely, when the temperature of the rewritable non-volatile memory module 406 gradually decreases, the memory management circuit 602 may gradually extend the time length of the time interval. For example, when the temperature of the rewritable non-volatile memory module 406 is 80 degrees, the memory management circuit 602 may transmit the special control command every 5 seconds and/or the rewritable non-volatile memory module 406 may execute the operation of applying the electronic pulse carrying the positive voltage (for example, the electronic pulse PS(+) in FIG. 8A) to the at least one word line (or the second memory cell) every 5 seconds. When the temperature of the rewritable non-volatile memory module 406 drops to 60 degrees, the memory management circuit 602 may transmit the special control command every 10 seconds and/or the rewritable non-volatile memory module 406 may execute the operation of applying the electronic pulse carrying the positive voltage (for example, the electronic pulse PS(+) in FIG. 8A) to the at least one word line (or the second memory cell) every 10 seconds.

In an exemplary embodiment, the electronic pulse may carry a negative voltage. That is, after programming the first memory cells in the first physical erasing unit, the electronic pulse carrying the negative voltage may be applied to the second memory cells including the first memory cells in the first physical erasing unit. The electronic pulse carrying the negative voltage may be configured to slightly reduce the number of electrons in the tunneling oxide layer of at least one of the second memory cells.

Figure 9A:
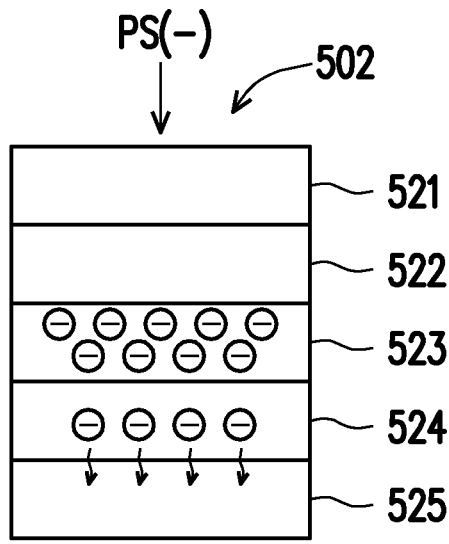
FIG. 9A is a schematic diagram of applying an electronic pulse carrying a negative voltage to a memory cell according to an exemplary embodiment of the disclosure.

FIG. 9A is a schematic diagram of applying an electronic pulse carrying a negative voltage to a memory cell according to an exemplary embodiment of the disclosure. Please refer to FIG. 9A. The memory cell 502 is taken as an example of a certain second memory cell. After an electronic pulse PS(−) carrying a negative voltage is applied to the control gate 521 of the memory cell 502, some electrons may be repelled from the tunneling oxide layer 524 to the substrate 525. Afterwards, when the memory cell 502 executes erasure to apply the erase voltage to the control gate 521, the electrons in the charge trapping layer 523 may be cleanly removed, thereby improving the erasing efficiency of the memory cell 502.

In an exemplary embodiment, the voltage of the electronic pulse PS(−) may be slightly lower than the voltage (that is, the channel voltage) of the substrate 525 of the memory cell 502. In this way, after applying the electronic pulse PS(−) to the memory cell 502, some free electrons originally located in the tunneling oxide layer 524 may be repelled by the electronic pulse PS(−) and dissipate into the substrate 525.

Figure 9B:
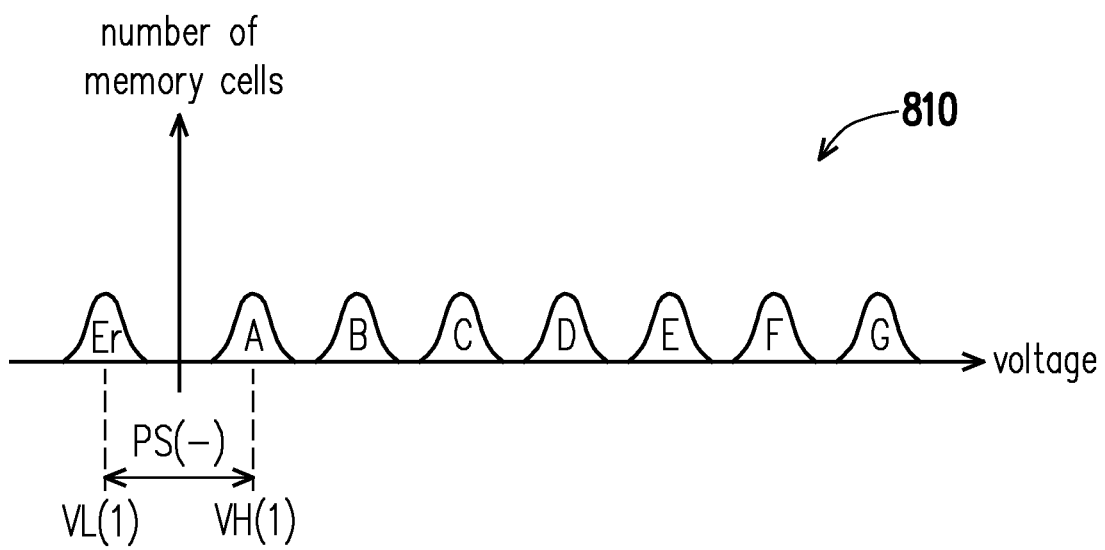
FIG. 9B is a schematic diagram of a voltage range of the electronic pulse carrying the negative voltage according to an exemplary embodiment of the disclosure.

FIG. 9B is a schematic diagram of a voltage range of the electronic pulse carrying the negative voltage according to an exemplary embodiment of the disclosure. Please refer to FIG. 9A and FIG. 9B. Similar to the exemplary embodiment of FIG. 8B, in an exemplary embodiment of FIG. 9B, it is also assumed that the first memory cell (or the second memory cell) is operating in the TLC programming mode.

In an exemplary embodiment, the voltage of the electronic pulse PS(−) may be approximately between voltages VL(1) and VH(1). The voltage VL(1) is a preset voltage level corresponding to the status Er. The voltage VH(1) is a preset voltage level corresponding to the status A. Alternatively, in an exemplary embodiment, assuming that there is a middle voltage level between the preset voltage level corresponding to the status Er and the preset voltage level corresponding to the status A (for example, at the vertical axis of FIG. 9B), the voltage of the electronic pulse PS(−) may be between the preset voltage level corresponding to the status Er and the middle voltage level. Alternatively, in an exemplary embodiment, the electronic pulse PS(−) only needs to carry a relatively negative voltage compared to the substrate 525 (or the channel) of the memory cell 502.

In an exemplary embodiment, the memory management circuit 602 may mark the data stored in the first physical erasing unit as invalid. For example, the operation of marking the data stored in the first physical erasing unit as invalid may be automatically executed by the memory management circuit 602 in response to data deletion of the host system 11 or data movement (for example, garbage collection) inside the memory management circuit 602. After marking the data stored in the first physical erasing unit as invalid, the memory management circuit 602 may transmit the special control command to instruct the rewritable non-volatile memory module 406 to apply the electronic pulse carrying the negative voltage (for example, the electronic pulse PS(−) in FIG. 9A) to the at least one word line (or the second memory cell). Thereafter, the memory management circuit 602 may transmit the erase command sequence to the rewritable non-volatile memory module 406 to instruct the rewritable non-volatile memory module 406 to erase the first physical erasing unit.

In an exemplary embodiment, after programming the first memory cell, the memory management circuit 602 may continuously instruct the rewritable non-volatile memory module 406 to apply the electronic pulse carrying the positive voltage (for example, the electronic pulse PS(+) in FIG. 8A) to the second memory cell by the special control command, so as to maintain or improve the data preservation capacity of the first memory cell (or the second memory cell). However, after marking the data stored in the first physical erasing unit as invalid (and before actually erasing the first physical erasing unit), the memory management circuit 602 may change to instructing the rewritable non-volatile memory module 406 to apply the electronic pulse carrying the negative voltage (for example, the electronic pulse PS(−) in FIG. 9A) to the second memory cell by the special control command, so as to improve the subsequent erasing efficiency of the first memory cell (or the second memory cell).

It should be noted that the above exemplary embodiments are exemplified with the rewritable non-volatile memory module 406 applying a specific electronic pulse to the second memory cell in response to the command (that is, the special control command) from the memory management circuit 602. However, in an exemplary embodiment, the rewritable non-volatile memory module 406 may also automatically execute the operation of applying the electronic pulse carrying the positive voltage (for example, the electronic pulse PS(+) in FIG. 8A) to the second memory cell after programming the first memory cell without the instruction from the memory management circuit 602, and/or the memory management circuit 602 may automatically execute the operation of applying the electronic pulse carrying the negative voltage (for example, the electronic pulse PS(−) in FIG. 9A) to the second memory cell before erasing the first physical erasing unit, which is not limited by the disclosure.

Figure 10:
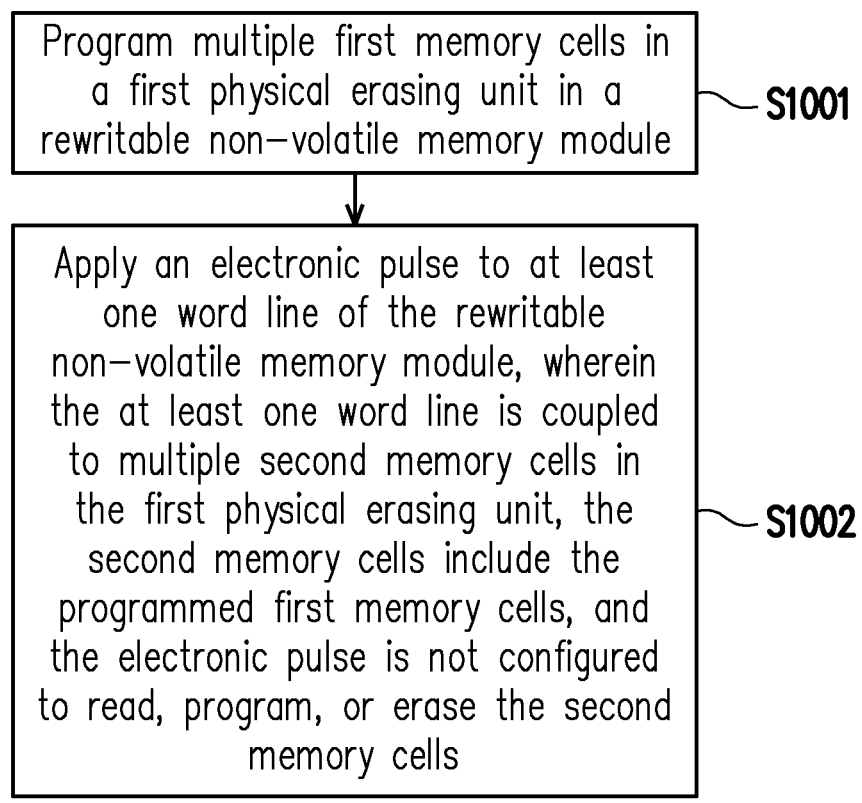
FIG. 10 is a flowchart of a memory control method according to an exemplary embodiment of the disclosure.

FIG. 10 is a flowchart of a memory control method according to an exemplary embodiment of the disclosure. Please refer to FIG. 10. In Step S1001, multiple first memory cells in a first physical erasing unit in a rewritable non-volatile memory module are programmed. In Step S1002, an electronic pulse is applied to at least one word line of the rewritable non-volatile memory module. The at least one word line is coupled to multiple second memory cells in the first physical erasing unit. The second memory cells include the programmed first memory cells. The electronic pulse is not configured to read, program, or erase the second memory cells.

However, each step in FIG. 10 has been described in detail as above and will not be repeated here. It is worth noting that each step in FIG. 10 may be implemented as multiple program codes or circuits, which is not limited by the disclosure. In addition, the method of FIG. 10 may be used in conjunction with the above exemplary embodiments or may be used alone, which is not limited by the disclosure.

In summary, when the first memory cells in the rewritable non-volatile memory module are in different statuses (for example, after being programmed or before being erased), a specific electronic pulse may be applied to the second memory cells containing the first memory cells. In this way, the data preservation capacity and/or the data erasing efficiency of the memory cells can be improved.

Although the disclosure has been disclosed in the above embodiments, the embodiments are not intended to limit the disclosure. Persons skilled in the art may make some changes and modifications without departing from the spirit and scope of the disclosure. The protection scope of the disclosure shall be determined by the scope of the appended claims.

What is claimed is:

1. A memory control method, applicable to a rewritable non-volatile memory module, wherein the rewritable non-volatile memory module comprises a plurality of physical erasing units, the memory control method comprising:
   programming a plurality of first memory cells in a first physical erasing unit among the plurality of physical erasing units; and
   applying an electronic pulse to at least one word line of the rewritable non-volatile memory module, wherein the at least one word line is coupled to a plurality of second memory cells in the first physical erasing unit, the plurality of second memory cells comprise the plurality of programmed first memory cells, and the electronic pulse is not configured to read, program, or erase the plurality of second memory cells.

2. The memory control method according to claim 1, wherein the step of applying the electronic pulse to the at least one word line comprises:
   applying the electronic pulse carrying a positive voltage to the at least one word line.

3. The memory control method according to claim 1, further comprising:
   repeatedly executing the step of applying the electronic pulse to the at least one word line every time a time interval has elapsed.

4. The memory control method according to claim 3, further comprising:
   obtaining a temperature of the rewritable non-volatile memory module; and
   adjusting the time interval according to the temperature.

5. The memory control method according to claim 1, wherein the step of applying the electronic pulse to the at least one word line comprises:
applying the electronic pulse carrying a negative voltage to the at least one word line.

6. The memory control method according to claim 1, further comprising:
erasing the plurality of second memory cells after applying the electronic pulse to the at least one word line.

7. The memory control method according to claim 1, wherein the electronic pulse is configured to change a number of electrons in a tunneling oxide layer of at least one of the plurality of second memory cells.

8. The memory control method according to claim 1, wherein the plurality of second memory cells comprise all memory cells in the first physical erasing unit.

9. A memory storage device, comprising:
a connection interface unit, configured to couple to a host system;
a rewritable non-volatile memory module, comprising a plurality of physical erasing units; and
a memory control circuit unit, coupled to the connection interface unit and the rewritable non-volatile memory module, wherein
the memory control circuit unit is configured to transmit a write command sequence to instruct to program a plurality of first memory cells in a first physical erasing unit among the plurality of physical erasing units,
the rewritable non-volatile memory module is configured to apply an electronic pulse to at least one word line, the at least one word line is coupled to a plurality of second memory cells in the first physical erasing unit, the plurality of second memory cells comprise the plurality of programmed first memory cells, and the electronic pulse is not configured to read, program, or erase the plurality of second memory cells.

10. The memory storage device according to claim 9, wherein the operation of applying the electronic pulse to the at least one word line comprises:
applying the electronic pulse carrying a positive voltage to the at least one word line.

11. The memory storage device according to claim 9, wherein the rewritable non-volatile memory module is configured to:
repeatedly execute the operation of applying the electronic pulse to the at least one word line every time a time interval has elapsed.

12. The memory storage device according to claim 11, wherein the memory control circuit unit is further configured to:
obtain a temperature of the rewritable non-volatile memory module; and
adjust the time interval according to the temperature.

13. The memory storage device according to claim 9, wherein the operation of applying the electronic pulse to the at least one word line comprises:
applying the electronic pulse carrying a negative voltage to the at least one word line.

14. The memory storage device according to claim 9, wherein the memory control circuit unit is further configured to:
transmit an erase command sequence to instruct to erase the plurality of second memory cells after applying the electronic pulse to the at least one word line.

15. The memory storage device according to claim 9, wherein the electronic pulse is configured to change a number of electrons in a tunneling oxide layer of at least one of the plurality of second memory cells.

16. The memory storage device according to claim 9, wherein the plurality of second memory cells comprise all memory cells in the first physical erasing unit.

17. A memory control circuit unit, comprising:
a host interface, configured to couple to a host system;
a memory interface, configured to couple to a rewritable non-volatile memory module, wherein the rewritable non-volatile memory module comprises a plurality of physical erasing units; and
a memory management circuit, coupled to the host interface and the memory interface, wherein
the memory management circuit is configured to transmit a write command sequence to instruct to program a plurality of first memory cells in a first physical erasing unit among the plurality of physical erasing units,
the memory management circuit is further configured to transmit a special control command to instruct to apply an electronic pulse to at least one word line of the rewritable non-volatile memory module, the at least one word line is coupled to a plurality of second memory cells in the first physical erasing unit, the plurality of second memory cells comprise the plurality of programmed first memory cells, and the electronic pulse is not configured to read, program, or erase the plurality of second memory cells.

18. The memory control circuit unit according to claim 17, wherein the operation of applying the electronic pulse to the at least one word line comprises:
applying the electronic pulse carrying a positive voltage to the at least one word line.

19. The memory control circuit unit according to claim 17, wherein the memory management circuit is further configured to:
repeatedly transmit the special control command every time a time interval has elapsed.

20. The memory control circuit unit according to claim 19, wherein the memory management circuit is further configured to:
obtain a temperature of the rewritable non-volatile memory module; and
adjust the time interval according to the temperature.

21. The memory control circuit unit according to claim 17, wherein the operation of applying the electronic pulse to the at least one word line comprises:
applying the electronic pulse carrying a negative voltage to the at least one word line.

22. The memory control circuit unit according to claim 17, wherein the memory management circuit is further configured to:
transmit an erase command sequence to instruct to erase the plurality of second memory cells after applying the electronic pulse to the at least one word line.

23. The memory control circuit unit according to claim 17, wherein the electronic pulse is configured to change a number of electrons in a tunneling oxide layer of at least one of the plurality of second memory cells.

24. The memory control circuit unit according to claim 17, wherein the plurality of second memory cells comprise all memory cells in the first physical erasing unit.

\* \* \* \* \*